United States Patent [19]

Nishimura

[11] Patent Number: 5,550,393

[45] Date of Patent: Aug. 27, 1996

[54] SEMICONDUCTOR LAYER STRUCTURE HAVING DISTRIBUTED STRAIN AND OPTICAL SEMICONDUCTOR DEVICE INCLUDING SUCH STRAINED LAYER

[75] Inventor: Michiyo Nishimura, Sagamihara, Japan

[73] Assignee: Canon Kabushiki Kaisha, Tokyo, Japan

[21] Appl. No.: 316,451

[22] Filed: Oct. 3, 1994

[30] Foreign Application Priority Data

Oct. 4, 1993 [JP] Japan .................................. 5-271329

[51] Int. Cl.$^6$ ................. H01L 31/0328; H01L 31/0336; H01L 31/072; H01L 31/109
[52] U.S. Cl. ........................................... 257/192; 257/194
[58] Field of Search ..................................... 257/192, 193

[56] References Cited

U.S. PATENT DOCUMENTS

| 5,239,410 | 8/1993 | Nishimura et al. | 359/344 |
| 5,331,410 | 7/1994 | Kawata | 257/192 |

OTHER PUBLICATIONS

"Defects In Epitaxial Multilayers", J. W. Matthews et al., Journal of Crystal Growth 27 (1974), pp. 118–125.
"Critical thickness in epitaxial GaAsP: comparison of theory and experiment", Bradley A. Fox et al., Journal of Crystal Growth 109 (1991), pp. 252–257.

*Primary Examiner*—Stephen O. Meier
*Attorney, Agent, or Firm*—Fitzpatrick, Cella, Harper & Scinto

[57] ABSTRACT

A semiconductor layer structure comprises a first semiconductor layer, and a second semiconductor layer adjacent the first layer at a boundary. The first semiconductor layer has a uniform lattice constant in its layering direction. The second semiconductor layer has a distributed lattice constant varying in its layering direction. Each region of the second semiconductor layer is strained due to biaxial strain introduced by a difference in lattice constant between each region and the first semiconductor layer. The strain in the second semiconductor layer has a distribution such that no crystal defects occur in the second semiconductor layer when the second layer is thicker than a critical thickness defined by the maximum strain in the second layer. The strained semiconductor layer structure may be used as a light confinement layer in a semiconductor optical device.

17 Claims, 11 Drawing Sheets

SEMICONDUCTOR LAYER STRUCTURE HAVING DISTRIBUTED STRAIN AND OPTICAL SEMICONDUCTOR DEVICE INCLUDING SUCH STRAINED LAYER

BACKGROUND OF THE INVENTION

1. Field of the Invention

The present invention relates to a semiconductor layer structure having distributed strain and an optical semiconductor device including this semiconductor layer structure.

2. Description of Related Background Art

Conventional strained lattice or superlattice structures include a plurality of kinds of semiconductor layers having different lattice constants layered with internal stresses left in the layers. Techniques for utilizing the strained lattice in an optical device, such as a semiconductor laser or a semiconductor optical amplifier, have been proposed, and using those techniques improves performance of various devices.

However, when introducing strain into the semiconductor layer to achieve the strained lattice, it is necessary to avoid introducing lattice defects. For this reason, the thickness, up to which the strained lattice can be constructed, is limited. This is called a critical thickness. The critical thickness has been theoretically and experimentally studied by, for example, Matthew et al. "J. Crystal Growth", 27 (1974) p. 118, and Fox et al. "J. Crystal Growth", 109 (1991) p. 252.

If the strained lattice is layered above the critical thickness, the strain begins to be partially relaxed owing to the occurrence of lattice defects. If the layer thickness is further increased, the strain will become completely relaxed. As a result, the lattice constant proper to the layered semiconductor layer appears and the strain will disappear.

Therefore, in a technical field wherein strain is a desired property, a semiconductor layer with strain therein typically must have a maximum thickness below the critical thickness. Furthermore, the critical thickness decreases as the lattice mismatching between layers increases resulting in a greater amount of strain. Therefore, use of the strained lattice is limited to relatively thin layers and it is generally used in combination with a quantum well structure. A strained lattice may be employed as a well layer, a barrier layer or a multi-layer in which those well layers and barrier layers are alternated.

As discussed above, a thick layer has rarely been constructed with strain existing therein, and use of such a layer has not been contemplated.

SUMMARY OF THE INVENTION

It is an object of the present invention to provide a layer structure device, into which strain is introduced and which has a relatively large thickness, and a semiconductor optical device including this layer structure, such as a semiconductor laser, whose characteristics are improved.

According to one aspect of the present invention which achieves the objective, a semiconductor layer structure comprises a first semiconductor layer and a second semiconductor layer. The first semiconductor layer has a uniform lattice constant in its layering direction. The second semiconductor layer has distributed lattice constant varying in its layering direction. The second semiconductor layer is strained due to a difference in lattice constant between the second semiconductor layer and the first semiconductor layer, and the strain in the second semiconductor layer has a distribution such that no crystal defects occur in the second semiconductor layer.

According to another aspect of the present invention which achieves the objective, a semiconductor optical device includes the above semiconductor layer structure and the second semiconductor layer is utilized as a graded index-separate confinement heterostructure for light confinement.

According to yet another aspect of the present invention which achieves the objective, a semiconductor layer structure comprises a first semiconductor layer and a second semiconductor layer disposed adjacent the first layer and in contact with the first layer at a boundary. The first semiconductor layer has a uniform lattice constant. The second semiconductor layer is strained due to a difference in lattice constant from the first layer. The strain at the boundary defines a critical thickness, and the thickness of the second layer is greater than the critical thickness.

According to yet a further aspect of the present invention, a semiconductor layer comprises a quantum well layer and at least one barrier layer disposed adjacent the quantum well layer. The barrier layer has a uniform lattice constant. At least one strained graded index-separate confinement heterostructure (GRIN) layer is disposed adjacent the barrier layer on a side opposite the quantum well layer and in contact with the barrier layer at a boundary. The strain at the boundary has a value so as to provide a light confinement factor for transverse electric light greater than a light confinement factor for transverse magnetic light. The strain value defines a critical thickness, and the GRIN layer has a thickness greater than the critical thickness.

These and other objects, features, and advantages of the present invention will become more apparent upon consideration of the following detailed description of the preferred embodiments when read in conjunction with the attached drawings.

DESCRIPTION OF THE PREFERRED EMBODIMENT

Figure 1:
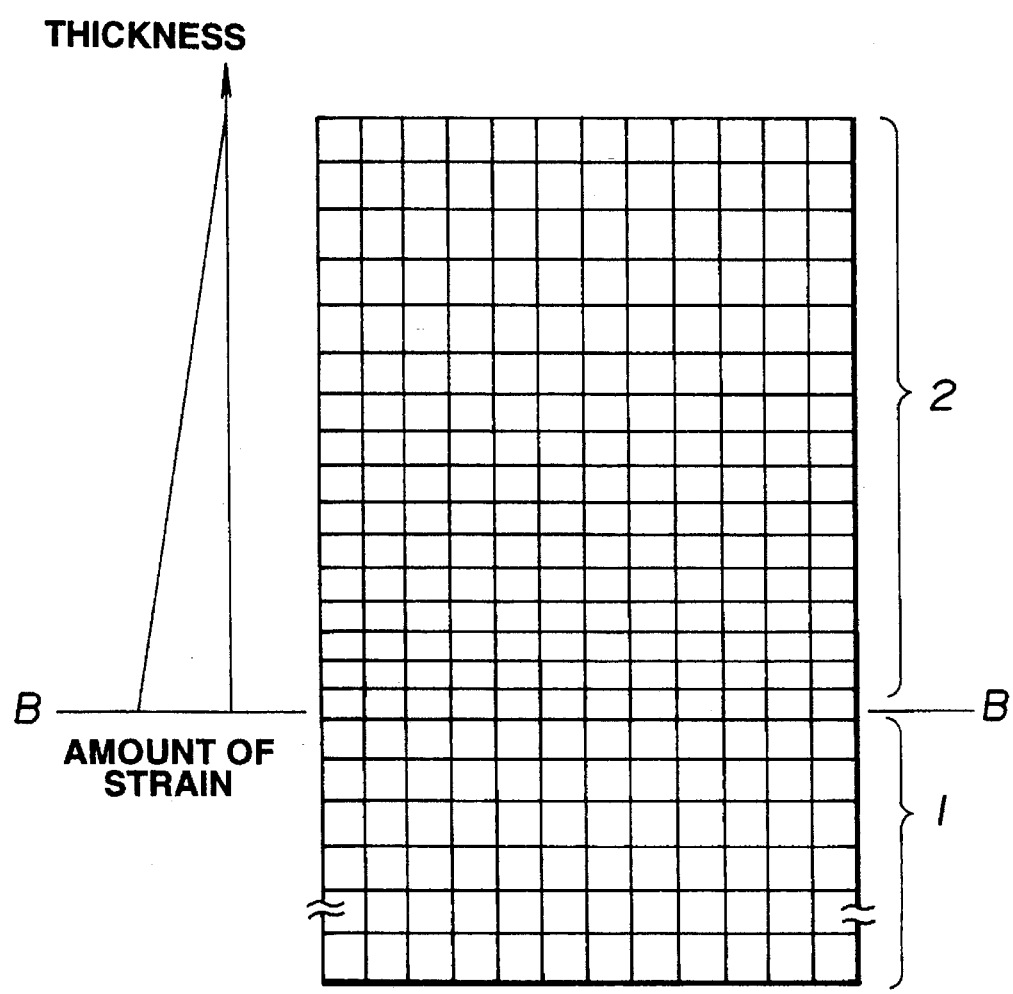
FIG. 1 illustrates lattice spacings of a semiconductor layer structure according to a first embodiment of the present invention.
Figure 2:
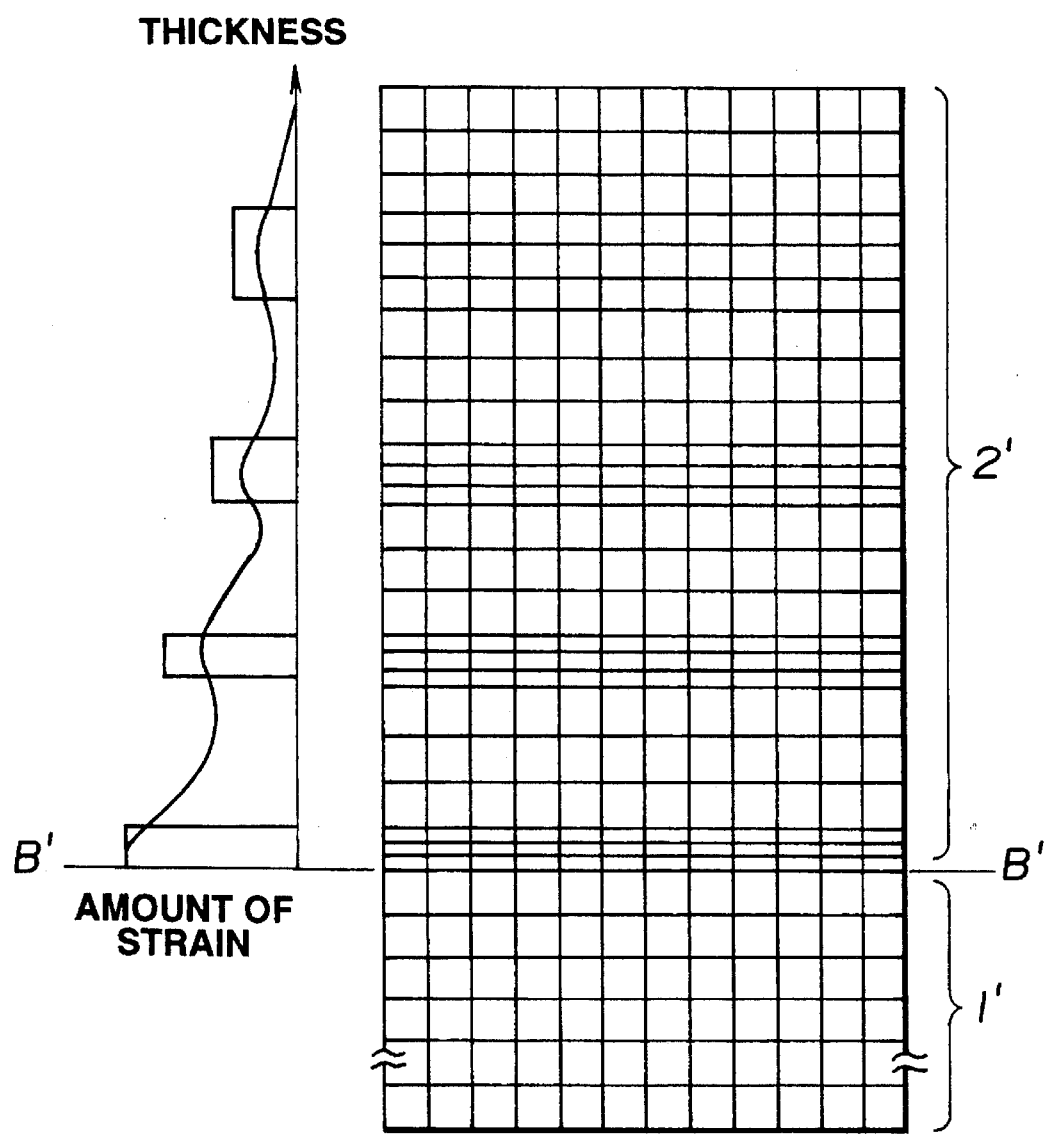
FIG. 2 illustrates lattice spacings of a semiconductor layer structure according to a second embodiment of the present invention.

FIGS. 1 and 2 depict the lattice spacings of semiconductor material constructed according to first and second embodiments respectively of the present invention. In FIGS. 1 and 2, reference numerals 1 and 1' respectively designate a first semiconductor layer which respectively has uniform lattice spacings, and reference numerals 2 and 2' respectively designate a second semiconductor layer with non-uniform lattice spacings. The second semiconductor layer 2 of FIG. 1 has a lattice structure in which the amount of strain gradually varies throughout the layer thickness. The amount of strain is largest at a boundary B between the second semiconductor layer 2 and the first semiconductor layer 1 because of greater lattice mismatch. In FIG. 2, the amount of strain in the second semiconductor layer 2' is changed in a step-like manner in the layer thickness direction by alternately constructing strained and non-strained regions within the second semiconductor layer 2'. Also in the second embodiment, the amount of strain is largest at a boundary B' between the second semiconductor layer 2' and the first semiconductor layer 1'. Using such structures, a relatively thick strained layer can be formed without introducing lattice defects.

Examples, in which those layer structures are applied to optical devices, will be described hereinbelow.

Figure 3:
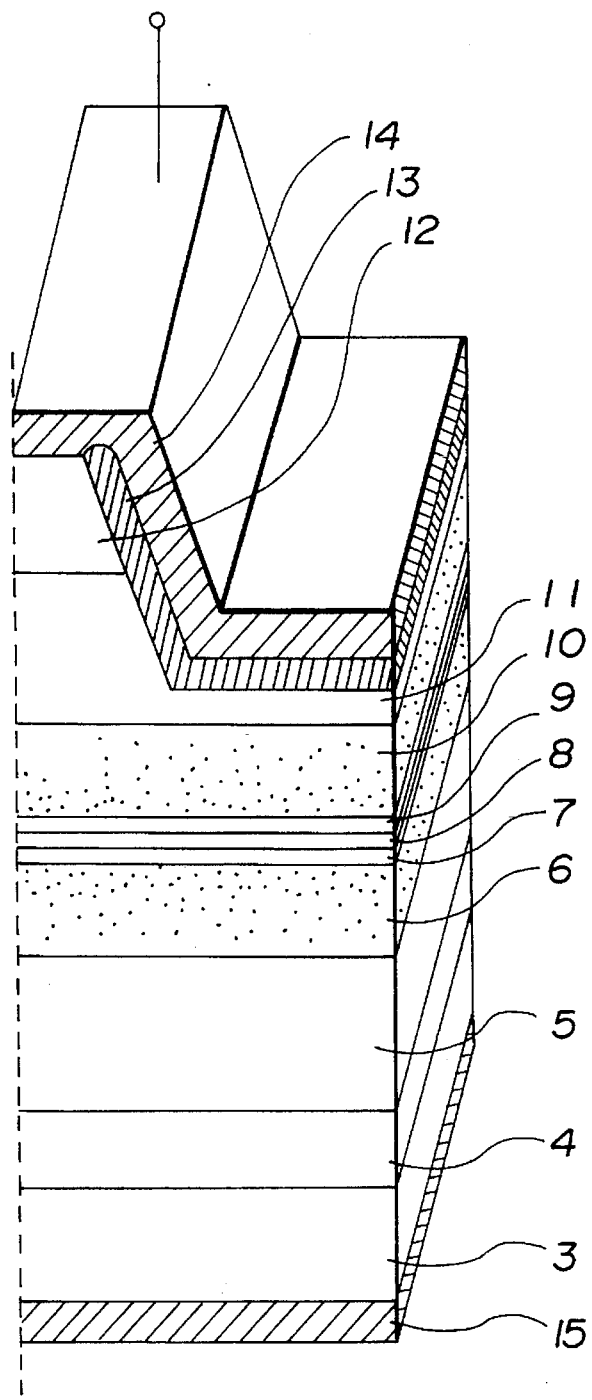
FIG. 3 is a perspective view illustrating a semiconductor laser which includes the invention.
Figure 4A:
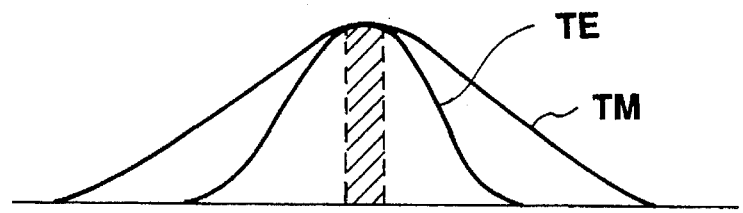
FIG. 4A illustrates TE and TM light confinement spectra according to the invention.
Figure 4B:
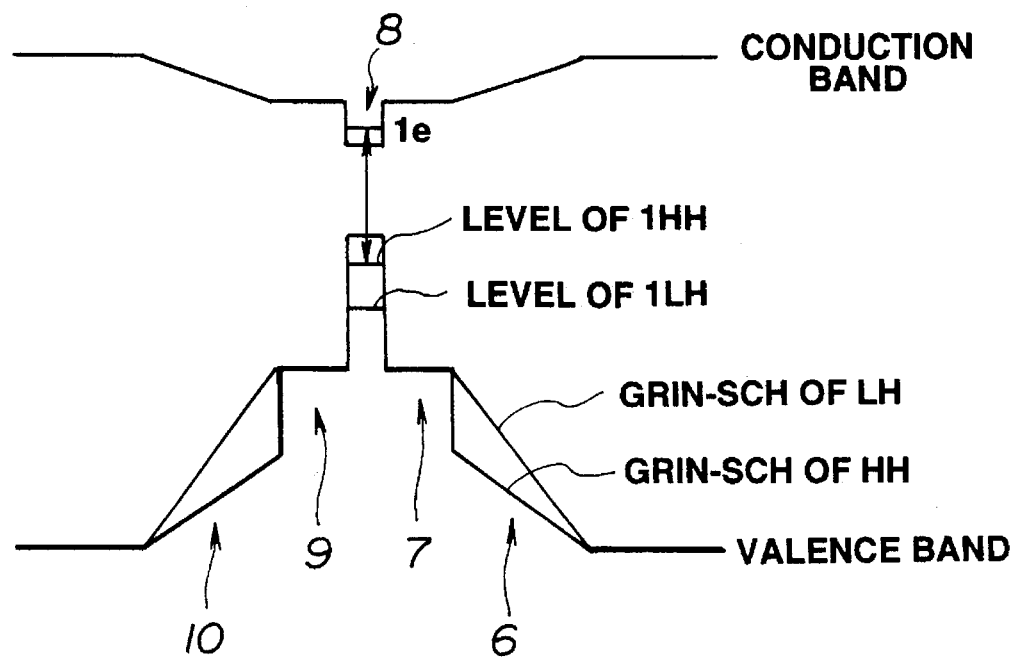
FIG. 4B is a band structure diagram illustrating energy gap tailoring according to the invention.
Figure 5:
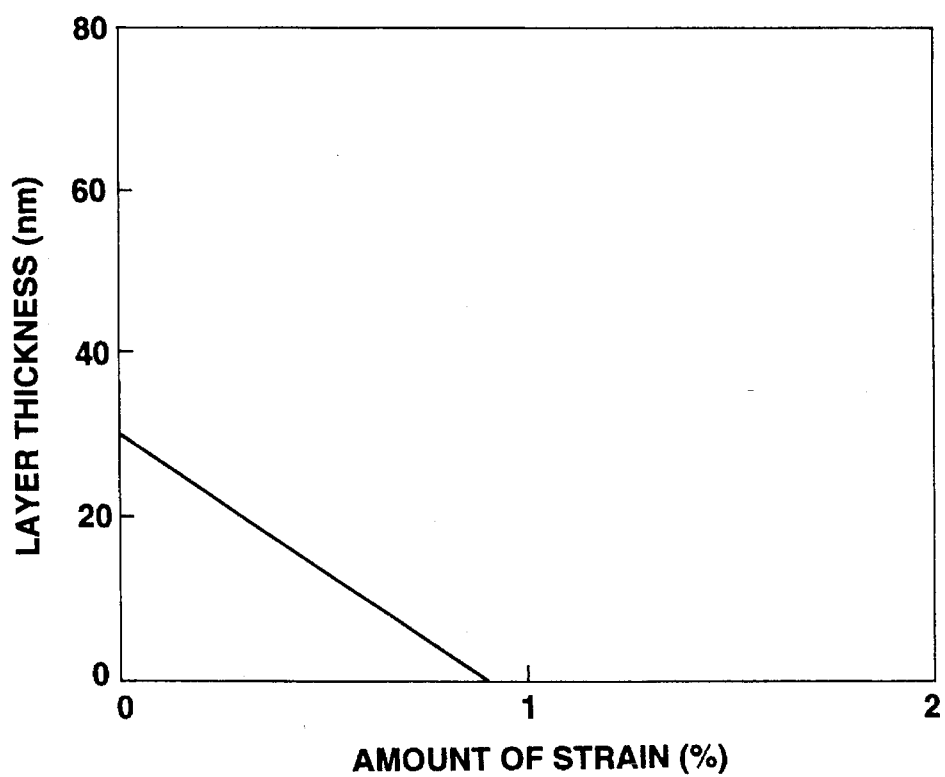
FIG. 5 is a graph illustrating an example of a strain distribution in a graded index-separate confinement heterostructure (GRIN-SCH) layer.

In FIGS. 3–5, a semiconductor laser is constructed including the above-discussed strained layer structure, which is used as a light confinement layer. FIG. 3 illustrates the layer structure of the semiconductor laser, FIGS. 4A and 4B illustrate the manner of light confinement and the band structure of the layer, and FIG. 5 shows the distribution of strain or distributed strain in a graded index (GRIN) layer.

In FIG. 3, on a (100) oriented crystalline substrate 3 of n-GaAs, an n-GaAs buffer layer 4 having a thickness of 1 µm, an n-$Al_{0.5}Ga_{0.5}As$ clad layer 5 having a thickness of 1.5 µm, an $Al_xGa_{1-x}As_{1-y}P_y$ (x=0.5, y=0→x=0.18, y=0.25) GRIN layer 6 having a thickness of 30 nm, an $Al_{0.18}Ga_{0.82}As$ barrier layer 7 having a thickness of 12 nm, a GaAs well layer 8 having a thickness of 6 nm, an $Al_{0.18}Ga_{0.82}As$ barrier layer 9 having a thickness of 12 nm, an $Al_xGa_{1-x}As_{1-y}P_y$ (x=0.18, y=0.25→x=0.5, y=0) GRIN layer 10 having a thickness of 30 nm, a p-$Al_{0.5}Ga_{0.5}As$ clad layer 11 having a thickness of 1.5 µm, and a p-GaAs cap layer 12 having a thickness of 0.5 µm are formed in this order by using metal organic chemical vapor deposition (MOCVD) method.

Then, etching is performed halfway through the p-$Al_{0.5}Ga_{0.5}As$ clad layer 11 with a raised stripe portion, having a width of 3 µm (a right half thereof is shown in FIG. 3), remaining. After an insulating layer 13 of silicon nitride is deposited over the entire surface, the insulating layer on the stripe surface is removed. Further, an upper electrode 14 of Au-Cr is deposited, and a lower electrode 15 of Au-Ge is deposited on the bottom surface of the substrate 3. The wafer is cleaved into a generally rectangular shape with a length of 300 µm along a direction perpendicular to the extending direction of the stripe.

The oscillation mode of the thus-fabricated device will be described. As seen from FIGS. 4A and 4B, the device has a quantum well structure 7, 8 and 9, which causes degeneracy of energy levels of heavy holes (HH) and light holes (LH) to be released in its valence band. Thus, the energy level of HH is higher in position than the energy level of LH in the valence band of well layer 8. Therefore, the transition between 1e (a ground level of electrons in the conduction band) and 1HH (a ground level of heavy holes in the valence band) most contributes to oscillation. Hence, the gain coefficient $g_{TE}$ of transverse electric (TE) light is larger than the gain coefficient $g_{TM}$ of transverse magnetic (TM) light.

The light confinement factor Γ is also increased for TE light owing to the strained GRIN-SCHs 6 and 10 which are features of this embodiment. In particular, in the energy distribution for HH, its band gap is widened due to biaxial tensile strain introduced by lattice mismatch. As a result, the refractive index of the region around the active region 8 is lowered for TE light, and a difference in the refractive index for the light confinement factor $Γ_{TE}$ of TE light is made large. Conversely, the band gap for LH is narrowed, and a difference in the refractive index for the light confinement factor $Γ_{TM}$ of TM light is decreased. Therefore, although a slight difference has been observed in the relationship between $Γ_{TE}$ and $Γ_{TM}$ ($Γ_{TE} > Γ_{TM}$) in a non-strained prior art GRIN-SCH structure, the difference between light confinement factors for TE and TM light is further increased by the structure of this embodiment.

Oscillation gain G mainly depends on a product of a gain coefficient g and light confinement factor Γ. Oscillation gain of TE light is typically much greater than for TM light ($Γ_{TE}g_{TE} >> g_{TM}Γ_{TM}$) in a device constructed in accord with the invention. Increasing gain allows reduction of the oscillation threshold, as well as suppression of an amplified spontaneous emission component (ASE) of TM light. Therefore, the modulation characteristics of the device can be improved by enhancing the preferable TE oscillation characteristic.

The strained GRIN-SCH structure 6 and 10 of this device will be described in detail. The distribution of strain for obtaining the energy band of FIG. 4B is shown in FIG. 5. A solid line depicts the amount of strain varying along the direction of layer thickness from the boundary with the barrier layer 7 or 9 (at layer thickness=0 nm) to the boundary with the clad layer 5 or 11 (at layer thickness=30 nm). The amount of strain is seen to be largest at the boundaries with the barrier layers 7 or 9, and gradually decreases to zero (0) at a thickness of 30 nm. Such a variation in the strain can be obtained by changing the mole fraction of P. Preferably, the mole fraction of P is linearly reduced from 0.25 to 0. However, since the band gap is decreased if the mole fraction of P is reduced, the mole fraction of Al is correspondingly increased from 0.18 to 0.5 so that the band structure as shown in FIG. 4B can be attained while the amount of strain is maintained at desired values. The layer structure of this embodiment is effective in increasing the TE light confinement factor $Γ_{TE}$, by constructing relatively thick (30 nm) strained GRIN layers, without introducing crystal defects.

Figure 6:
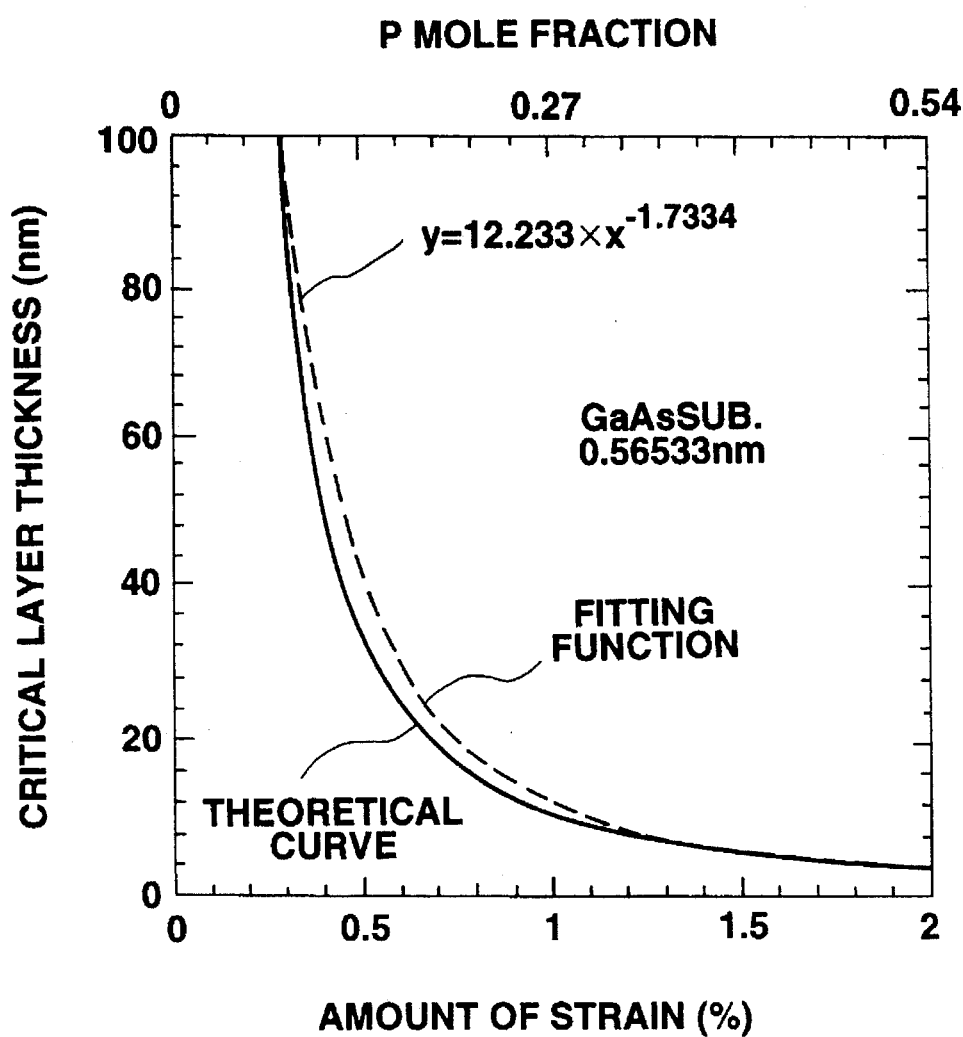
FIG. 6 is a graph illustrating the critical thickness of a single strained layer.

FIG. 6 depicts a graph showing the critical thickness for a single layer having a given, uniform amount of strain. This graph shows a curve (a solid line) obtained analytically by Fox et al. "J. Crystal Growth, 109 p. 252 (1991)" and its fitting function (dotted line) represented by $y=12.233x^{-1.7334}$. As seen from this graph, the critical thickness becomes smaller as the amount of strain increases, and large as the amount of strain decreases. A layer thickness, larger than the calculated maximum thickness, becomes possible to construct if the amount of strain is changed from a first value to a second smaller value before the critical thickness for the first value is reached. If this principle is further extended, a semiconductor layer, whose thickness would remain below the critical thickness, can be constructed by appropriately distributing the amount of strain. The distribution of the strain shown in FIG. 5 is an example that satisfies this condition.

Figure 7:
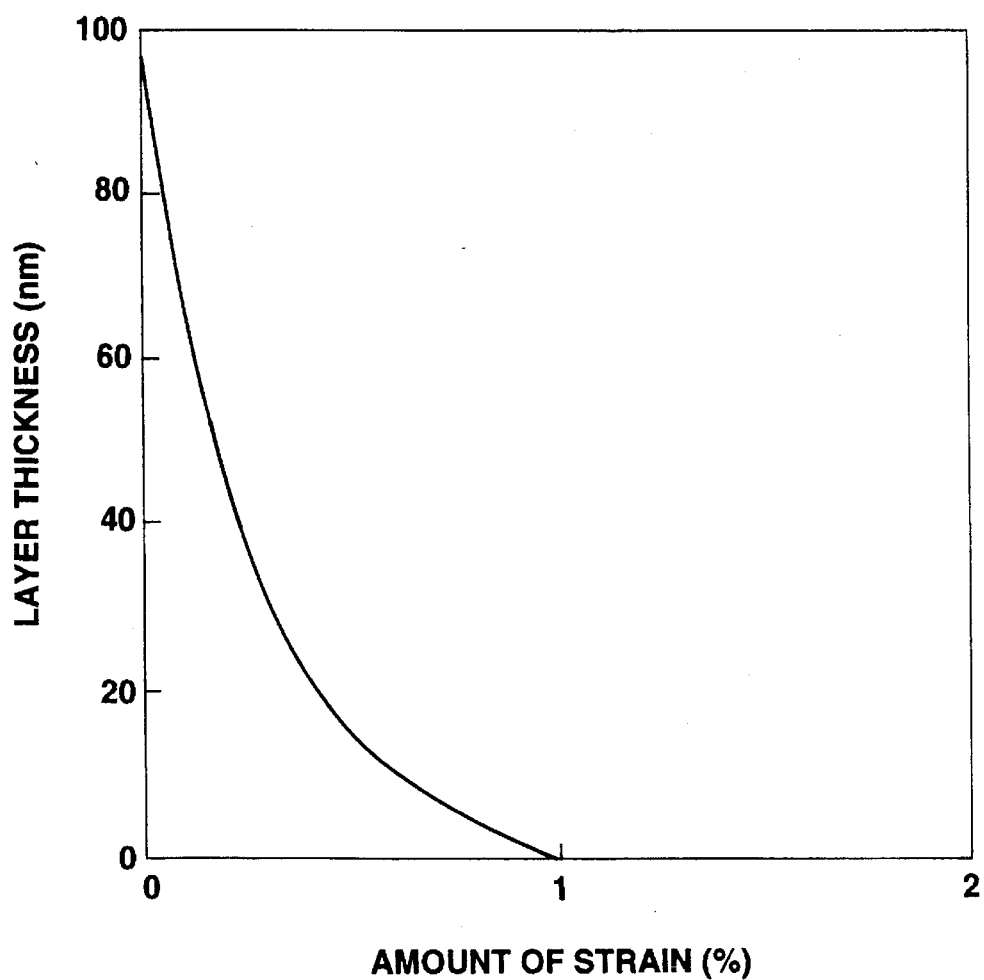
FIG. 7 is a graph illustrating a further example of a strain distribution in a GRIN-SCH layer.
Figure 8:
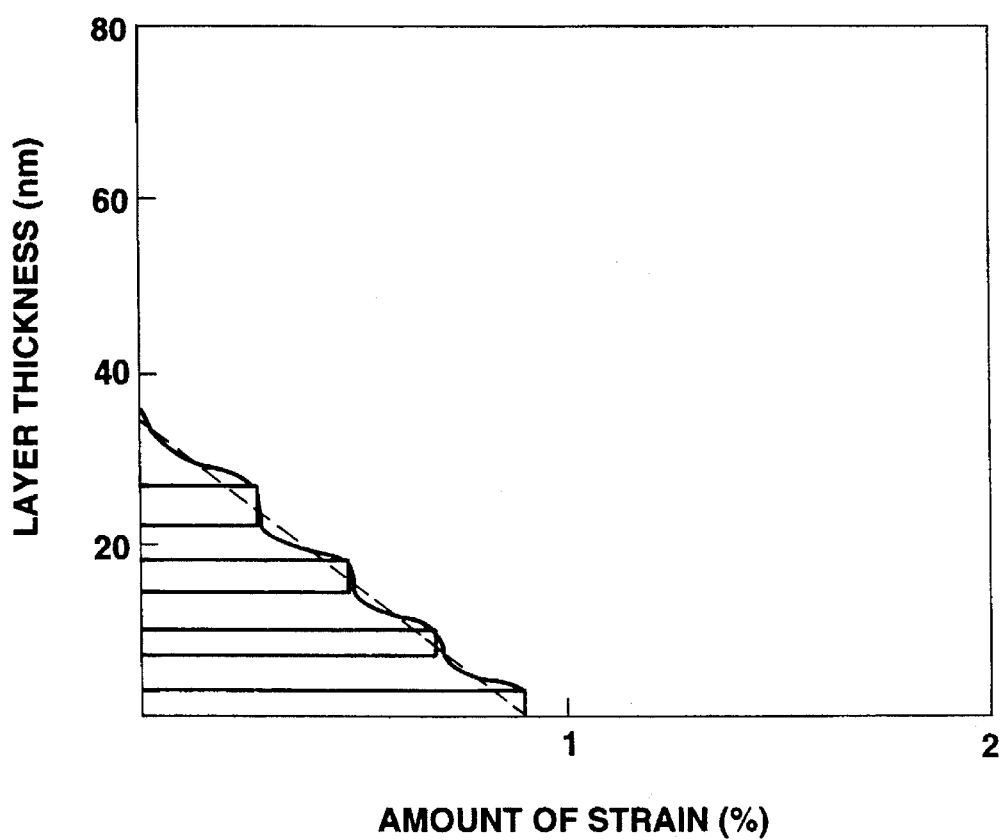
FIG. 8 is a graph illustrating still another example of a strain distribution in a GRIN-SCH layer.

Other examples of strain distributions, which can achieve a relatively thick layer without introducing lattice defects, are illustrated in FIGS. 7 and 8.

FIG. 7 shows an example in which the strain distribution is approximated by a quadratic function. In this example, strain is sharply decreased in a region wherein the strain is large. The strain is gradually decreased in a region wherein the strain is small. A larger amount of strain is provided at the boundary portion of the layer, and by appropriately decreasing the amount of strain through the layer, the entire layer thickness can be extended. A higher order function (i.e., more than quadratic) may be employed, in order to maximize the layer thickness by more closely matching strain distribution to the critical thickness curve.

FIG. 8 shows an example in which the strain distribution is provided in a step-like manner. A strain distribution of this kind may be provided by, for example, the lattice structure of the second semiconductor layer 2' shown in FIG. 2. In this structure, regions exist whose lattice constants are equal to that of the substrate, but the thickness of these regions is small. Strain cannot be confined completely within strained regions or regions whose lattice constants are different from that of the substrate. Therefore, in a step-type strain distribution, although the strain wll decrease in the equal lattice constant region, strain is again restored in a next region whose lattice constant is different from that of the substrate. The step-type strain distribution of FIG. 8 example attains generally the same layer thickness as the continuous strain distribution shown in FIG. 5.

A method of determining defect free strain distributions will be described. The graph shown in FIG. 6 defines the critical thickness, by a curve analytically obtained by Fox et al. This curve is approximated by a function $y=12.233 \times x^{-1.7334}$ (the fitting function) where y is the critical thickness for a given amount of strain x. That function can be approximated by $y \cdot x^2 = $ constant. From this last expression, the critical thickness of a layer in cases where strain is distributed through the layer can be readily predicted. So long as the strain distribution satisfies the following relation, $$\int_0^\infty x^2 \cdot dy < 12.2$$

the critical thickness will not be exceeded, and a defect free layer can be constructed. The value of the constant 12.2 depends on the layered material and may therefore vary when other material are used.

When applied to linear strain distributions, the function may be further simplified. For example, where the average amount of strain is $<x>$ and the critical thickness when the strain $<x>$ is created by a single layer $<d>$ keeping $\int_0^\infty x^2 \cdot dy << x^2 > \cdot <d>$ is sufficient to construct a defect free layer.

It is preferable to form strain-distributed layers on both sides of the quantum well structure in order to use the strained GRIN layer as a light confinement layer. The quantum well structure needs to be sufficiently thick in order to consider the strained GRIN layers on both sides as independent from each other. In the layer of FIG. 3, the layer thickness of the quantum well structure is preferably 30 nm, and this value has been determined as sufficient to satisfy the above condition. If the quantum well structure is not sufficiently thick, the critical thickness must be considered as the total layer thickness including the quantum well structure as well as the GRIN layers on both sides. Therefore, in this case, the amount of strain cannot be increased as much as if the well structure were thicker.

As described above, the layer structure of the present invention is used as a GRIN-SCH layer in the layer of FIG. 3, so that the oscillation threshold of a semiconductor laser can be reduced and the modulation characteristic for TE output light can be improved.

In the foregoing, a so-called Fabry-Perot type laser, which includes end facets used as reflective mirrors, is preferred, but the present invention also can be applied to a distributed feedback (DFB) type laser which has a diffraction grating that serves as reflective mirrors. When a corrugation is used as the diffraction grating, the position of the corrugation must be carefully determined. If the corrugation is positioned remote from the position of an active layer of the laser, the reflective properties of the mirror for TE light are inferior to those for TM light and an expected TE oscillation amplitude is difficult to obtain. If the active layer is positioned close to the corrugation and to the optical distribution of propagated TE light, the oscillation mode of TE light becomes dominant, similar to the Fabry-Perot type laser. Furthermore, in a gain-coupling type DFB laser, for example, which has no corrugation, the effect of the present invention can be fully achieved.

A semiconductor optical amplifier constructed in accord with the present invention will be described with reference to FIGS. 9–11. In this embodiment, the amplifier is constructed such that the polarization characteristic of light confinement can be eliminated.

Figure 9:
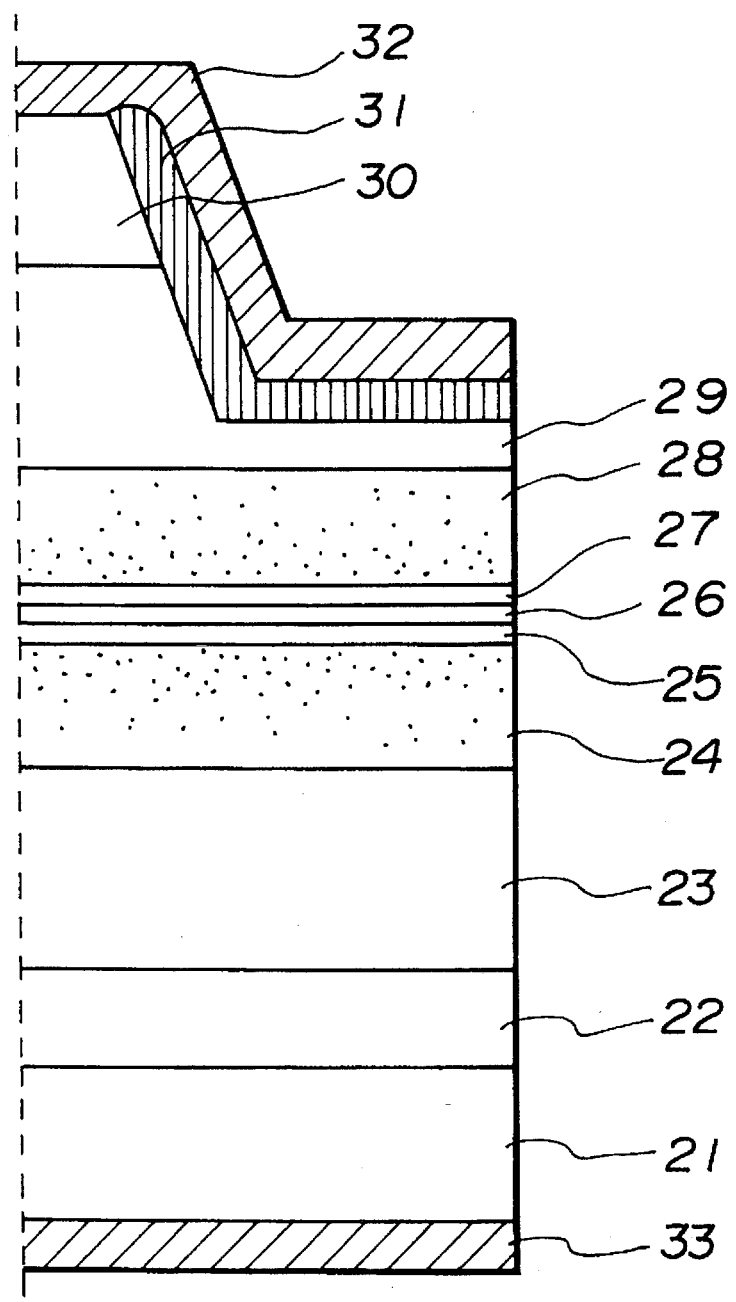
FIG. 9 is a cross-sectional view illustrating a semiconductor optical amplifier constructed in accord with the present invention.
Figure 10:
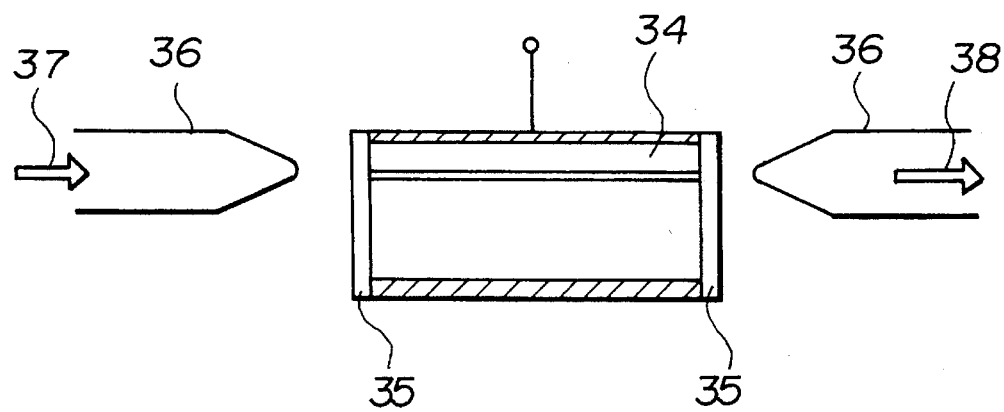
FIG. 10 is a cross-section view illustrating the placement of a semiconductor optical amplifier in an optical system.

In FIG. 9, on a (100) oriented crystalline substrate 21 of n-InP, an n-InP buffer layer 22 having a thickness of 1 μm, an n-InGaAsP clad layer 23 having a thickness of 1.5 μm ($\lambda_g$ (a wavelength corresponding to band gap energy)=1.2 μm composition), a strained GRIN layer 24 of InGaAsP having a thickness of 100 nm, an InGaAsP barrier layer 25 having a thickness of 20 nm ($\lambda_g$=1.3 μm composition), a strained well layer 26 of $In_{0.4}Ga_{0.6}As$ having a thickness of 4 nm, an InGaAsP barrier layer 27 having a thickness of 20 nm ($\lambda_g$=1.3 μm composition), a strained GRIN layer 28 of InGaAsP having a thickness of 100 nm, a p-InGaAsP clad layer 29 having a thickness of 1.5 μm ($\lambda_g$=1.2 μm composition), and a p-$In_{0.53}Ga_{0.47}As$ cap layer 30 having a thickness of 0.5 μm are formed in this order by MOCVD under reduced pressure.

An insulating layer 31 and an upper electrode 32 are formed in the same manner as described in connection with FIG. 3, and a ridge type semiconductor laser structure 34 is fabricated (see FIG. 10). Further, antireflection coatings 35 are provided on end facets of the device, and optical fibers 36 are positioned for inputting and outputting light into and out of the device.

Bias current below the oscillation threshold is injected into the device so that the semiconductor optical amplifier can amplify light 37 input from outside and supply the amplified light as an output 38. However, when an active layer having the quantum well structure of a conventional semiconductor optical amplifier is used, polarization dependency of gain occurs in the device and the light output power fluctuates due to polarization fluctuation caused during transmission through an optical fiber.

In the amplifier of FIG. 9, strain is introduced into the well layer 26 of the quantum well structure to cause HH and LH energy levels to approach each other as illustrated in FIG.

Figure 11A:
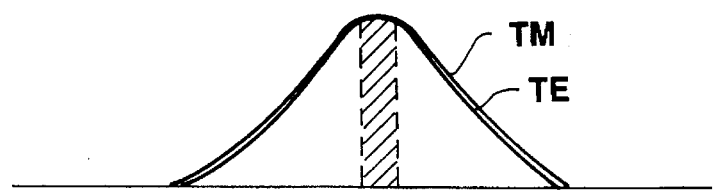
FIG. 11A illustrates TE and TM light confinement spectra according to the invention.
Figure 11B:
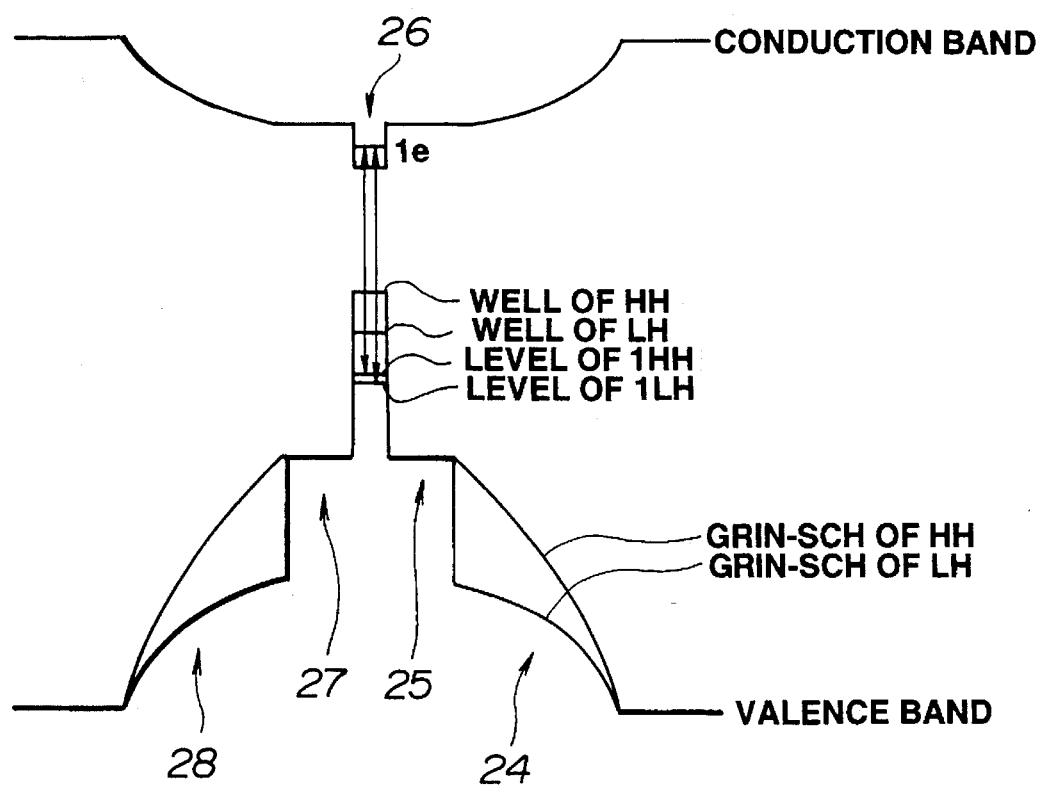
FIG. 11B is a band structure diagram further illustrating energy gap tailoring according to the invention.

11B. Thus, the polarization dependency of optical gain is substantially eliminated, and at the same time TE vs TM polarization dependency is removed by appropriate light confinement. While tensile stress was given to the strained GRIN layer in the embodiment of FIG. 3, compression stress is imparted to the strained GRIN layers 24 and 28 in the embodiment of FIG. 9. Therefore, the refractive index difference for light confinement is made larger for TM light rather than TE light. Since light confinement for TE light is stronger when no strain exists, the light confinement for TM light can be made equal to that for TE light if the amount of strain is appropriately selected to raise the HH valence band levels above the LH valence band levels in the GRIN layer as depicted in FIGS. 11A and 11B.

In the embodiment of FIG. 9, a structure which removes the polarization dependency of gain is described, but other structures suggest themselves equally. Optical gain for TE light may be increased if no strain is introduced into a well layer and a conventional quantum well is used. The amount of strain in the GRIN layer may be increased to the point that the light confinement for TM light surpasses that for TE light. Since gain is proportional to the product of optical gain g and light confinement factor Γ, such a structure becomes insensitive to polarization if conditions are established so that Γ·g of TE light is equal to Γ·g of TM light.

The embodiment of FIG. 9 adopts a strain distribution according to a quadratic function as shown in FIG. 7. Compared to a step-type distribution, light confinement becomes stronger in the case of a quadratic strain distribution function, and hence the structure becomes preferable as an optical amplifier. Furthermore, although strain is introduced into the well layer 26 of the quantum well structure, the barrier layers 25 and 27 are made sufficiently thick so that strain distributions can be independently designed in the strained GRIN layers 24 and 28 on both sides.

As described in the foregoing, according to the present invention, a strained layer, into which strain is introduced according to a distribution and which has a relatively large thickness, can be fabricated. Further, output characteristics of a semiconductor optical device can be tailored by applying that strained layer structure thereto.

For example, the following characteristics can be obtained by introducing strain into a light confinement layer, particularly a GRIN-SCH layer.

In the case of a semiconductor laser, the light confinement factor of oscillation modes can be increased, and its oscillation threshold can be lowered.

In the case of a semiconductor optical amplifier, a difference in the light confinement factor between TE light and TM light can be substantially reduced, and the polarization dependency of gain can be removed.

While the present invention has been described with respect to what are presently considered to be the preferred embodiments, it is to be understood that the invention is not limited to the disclosed embodiments. The present invention is intended to cover various modifications and equivalent arrangements included within the sprit and scope of the appended claims.

What is claimed is:

1. A semiconductor optical device comprising:
   a first semiconductor layer, said first semiconductor layer having a uniform lattice constant in its layering direction; and
   a second semiconductor layer, said second semiconductor layer having a distributed lattice constant varying in its layering direction, said second semiconductor layer being strained due to a difference in the lattice constants between said said second semiconductor layer and said first semiconductor layer, a strain in said second semiconductor layer being controlled so that no crystal defects occur in said second semiconductor layer, a positional relation of energy levels of heavy holes and light holes in said second semiconductor layer being controlled so that said second semiconductor layer acts as a graded index-separate confinement heterostructure for confining TE light and TM light in respective desired energy levels.

2. A semiconductor layer structure according to claim 1, wherein the strain in the second semiconductor layer continuously varies in its layering direction.

3. A semiconductor layer structure according to claim 1, wherein the strain in said second semiconductor layer linearly decreases in its layering direction from the boundary with said first semiconductor layer.

4. A semiconductor layer structure according to claim 1, wherein the strain in said second semiconductor layer decreases in accordance with at least a second order function in its layering direction from the boundary with said first semiconductor layer.

5. A semiconductor optical device according to claim 1, wherein said second semiconductor layer includes a plurality of first regions each having substantially the same lattice constant as said first semiconductor layer, and a plurality of second regions disposed between the first regions in alternative fashion, and having lattice constants which vary in a step-like fashion, and where said first regions are influenced by strain in said second regions.

6. A semiconductor optical device according to claim 1, wherein the strain in said second semiconductor layer is distributed in accordance with a relation of $<x^2>\cdot<d>> \int_0^\infty x^2 \cdot dy$ where x is the amount of strain, y is the layer thickness, $<x>$ is an average of the amount of strain, and $<d>$ is the critical thickness when the strain of $<x>$ is created by a single layer.

7. A semiconductor optical device according to claim 1, wherein said first semiconductor layer comprises a quantum well layer.

8. A semiconductor optical device according to claim 1, wherein said optical device is constructed as a semiconductor laser.

9. A semiconductor optical device according to claim 8, wherein the strain in said second semiconductor layer is caused by tensile strain and the TE light is more strongly confined than the TM light in said semiconductor laser.

10. A semiconductor optical device according to claim 1, wherein said optical device is constructed as a semiconductor optical amplifier.

11. A semiconductor optical device according to claim 10, wherein the strain in said second semiconductor layer is caused by compression strain, and a polarization dependency of gain is small in said semiconductor optical amplifier.

12. A semiconductor optical device according to claim 1, wherein the strain in said second semiconductor layer is caused by tensile strain.

13. A semiconductor optical device according to claim 1, wherein the strain in said second semiconductor layer is caused by compression strain.

14. A semiconductor layer structure comprising:
   a first semiconductor layer, said first semiconductor layer having a uniform lattice constant in its layering direction; and
   a second semiconductor layer, said second semiconductor layer having a distributed lattice constant varying in its layering direction, said second semiconductor layer being tensile strained due to a difference in the lattice constants between said second semiconductor layer and said first semiconductor layer, and the tensile strain in said second semiconductor layer being controlled so that no crystal defects occur in said second semiconductor layer, wherein a tensile strain in said second semiconductor layer is distributed in accordance with a relation of $<x^2>\cdot<d>>\int_0^\infty x^2 \cdot dy$ where x is the amount of tensile strain, y is the layer thickness, $<x>$ is an average of the amount of tensile strain, and $<d>$ is the critical thickness when the tensile strain of $<x>$ is created by a single layer.

15. A semiconductor layer structure comprising:

a first semiconductor layer, said first semiconductor layer having a uniform lattice constant in its layering direction; and a second semiconductor layer having a boundary with said first semiconductor layer, said second semiconductor layer having a distributed lattice constant varying in its layering direction, said second semiconductor layer being strained due to a difference in the lattice constants between said second semiconductor layer and said first semiconductor layer, and a strain in said second semiconductor layer being controlled so that no crystal defects occur in said second semiconductor layer, wherein the strain in said second semiconductor layer decreases in accordance with at least a second order function in its layering direction from the boundary with said first semiconductor layer.

16. A semiconductor layer structure comprising:

a first semiconductor layer, said first semiconductor layer having a uniform lattice constant in its layering direction; and a second semiconductor layer, said second semiconductor layer having a distributed lattice constant varying in its layering direction, said second semiconductor layer being strained due to a difference in the lattice constants between said second semiconductor layer and said first semiconductor layer, and a strain in said second semiconductor layer being controlled so that no crystal defects occur in said second semiconductor layer, wherein said second semiconductor layer includes a plurality of first regions each having substantially the same lattice constant as said first semiconductor layer, and a plurality of second regions disposed between the first regions in alternating fashion and having lattice constants which vary in a step-like fashion, and where said first regions are influenced by strain in said second regions.

17. A semiconductor layer structure comprising:

a first semiconductor layer, said first semiconductor layer having a uniform lattice constant in its layering direction; and a second semiconductor layer, said second semiconductor layer having a distributed lattice constant varying in its layering direction, said second semiconductor layer being strained due to a difference in the lattice constants between said second semiconductor layer and said first semiconductor layer, and a strain in said second semiconductor layer being controlled so that no crystal defects occur in said second semiconductor layer, wherein the strain in said second semiconductor layer is distributed in accordance with a relation of $<x^2>\cdot<d>>\int_0^\infty x^2 \cdot dy$ where x is the amount of strain, y is the layer thickness, $<x>$ is an average of the amount of strain, and $<d>$ is the critical thickness when the strain of $<x>$ is created by a single layer.

\* \* \* \* \*

UNITED STATES PATENT AND TRADEMARK OFFICE
CERTIFICATE OF CORRECTION

PATENT NO. : 5,550,393
DATED : August 27, 1996
INVENTOR(S) : MICHIYO NISHIMURA

It is certified that error appears in the above-identified patent and that said Letters Patent is hereby corrected as shown below:

COLUMN 4

Lines 62-63, "$y=12.233x^-1.7334.$" should read --$y=12.233x^{-1.7334}.$--.
Line 64, "large" should read --larger--.

COLUMN 5

Line 31, "wll" should read --will--.
Lines 40-41, "$y=12.233xx^-1.7334$" should read --$y=12.233x^{-1.7334}$--.
Line 53, "are" should read --is--.

COLUMN 7

Line 56, "sprit" should read --spirit--.

UNITED STATES PATENT AND TRADEMARK OFFICE
CERTIFICATE OF CORRECTION

PATENT NO.   : 5,550,393
DATED        : August 27, 1996
INVENTOR(S)  : MICHIYO NISHIMURA It is certified that error appears in the above-identified patent and that said Letters Patent is hereby corrected as shown below:

COLUMN 8

```
Line 1,  "said said" should read --said--.
Line 10, "layer structure" should read --optical device--.
Line 13, "layer structure" should read --optical device--.
Line 17, "layer structure" should read --optical device--.
```

Signed and Sealed this

Eighteenth Day of February, 1997

Attest:

BRUCE LEHMAN

*Attesting Officer*   Commissioner of Patents and Trademarks